United States Patent
Mallet et al.

(10) Patent No.: US 8,407,637 B2
(45) Date of Patent: Mar. 26, 2013

(54) AUTOMATION OF THE ZERO-POLE IDENTIFICATION METHODS FOR THE STABILITY ANALYSIS OF MICROWAVE ACTIVE CIRCUITS

(75) Inventors: Alain Mallet, Mauzac (FR); Aitziber Anakabe Iturriaga, Barakaldo (ES); Geoffroy Soubercaze-Pun, Flournes (FR); Juan Maria Collantes Metola, Bilbao (ES)

(73) Assignee: Centre National d'Etudes Spatiales, Paris (FR)

( * ) Notice: Subject to any disclaimer, the term of this patent is extended or adjusted under 35 U.S.C. 154(b) by 88 days.

(21) Appl. No.: 13/126,134

(22) PCT Filed: Oct. 27, 2009

(86) PCT No.: PCT/FR2009/052070
§ 371 (c)(1),
(2), (4) Date: Jul. 13, 2011

(87) PCT Pub. No.: WO2010/049642
PCT Pub. Date: May 6, 2010

(65) Prior Publication Data
US 2011/0264422 A1  Oct. 27, 2011

(30) Foreign Application Priority Data
Oct. 27, 2008  (FR) ..................... 08 57276

(51) Int. Cl.
*G06F 17/50* (2006.01)
(52) U.S. Cl. ............. 716/106; 716/101; 716/136; 703/2
(58) Field of Classification Search ................... 716/101, 716/106, 136; 703/2
See application file for complete search history.

(56) References Cited

U.S. PATENT DOCUMENTS 6,937,971 B1 * 8/2005 Smith et al. ..................... 703/18
7,002,406 B2 * 2/2006 Risbo et al. ..................... 330/10

OTHER PUBLICATIONS

PCT/FR2009/052070 International Search Report (Dec. 30, 2009).
Barquinero et al., "Complete Stability Analysis of Multifunction MMIC Circuits," IEEE Transactions on Microwave Theory and Techniques, Oct. 1, 2007, pp. 2024-2033, vol. 55, No. 10, IEEE Service Center, Piscataway, NJ.
Ayllón et al., "Sensitivity Enhancement in Pole-Zero Identification Based Stability Analysis of Microwave Circuits," Integrated Nonlinear Microwave and Millimetre-Wave Circuits, Nov. 24, 2008, pp. 75-78, IEEE, Piscataway, NJ.
Anakabe et al., "Efficient Nonlinear Stability Analysis of Microwave Circuits Using Commercially Available Tools," European Microwave Conference, Oct. 1, 2002, pp. 1-5, IEEE, Piscataway, NJ.
Balsi et al., "Discussion and New Proofs of the Conditional Stability Criteria for Multidevice Microwave Amplifiers," IEE Proceedings: Microwaves, Antennas and Propagation, Apr. 3, 2006, pp. 177-181, vol. 153, No. 2, IEE, Stevenage, Herts, GB.

*Primary Examiner* — Naum Levin
(74) *Attorney, Agent, or Firm* — Patterson & Sheridan, L.L.P.

(57) ABSTRACT

A method of analyzing electrical stability of an active circuit splits a frequency response of an electrical or electronic circuit according to sub-bands (134, 136, 138) and in each sub-band (134, 136, 138) implements a step of determining an identification transfer function adapted for a stability analysis. The step of determining the transfer function is automatic and executed in the form of an identification loop, parameterized according to a current order of transfer function, and stopped when the norm of a phase error function for the error between the phase (222, 224, 226) of the current identified transfer function and that of the frequency response has exceeded a predetermined phase error threshold value.

13 Claims, 6 Drawing Sheets

Figure 2:
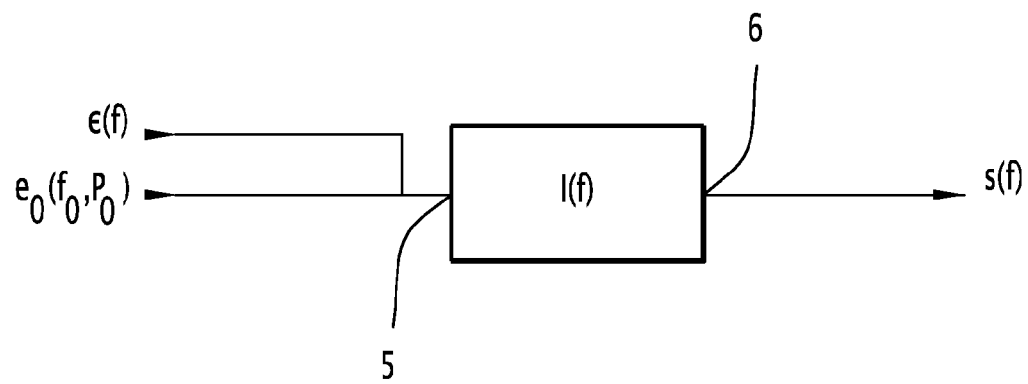

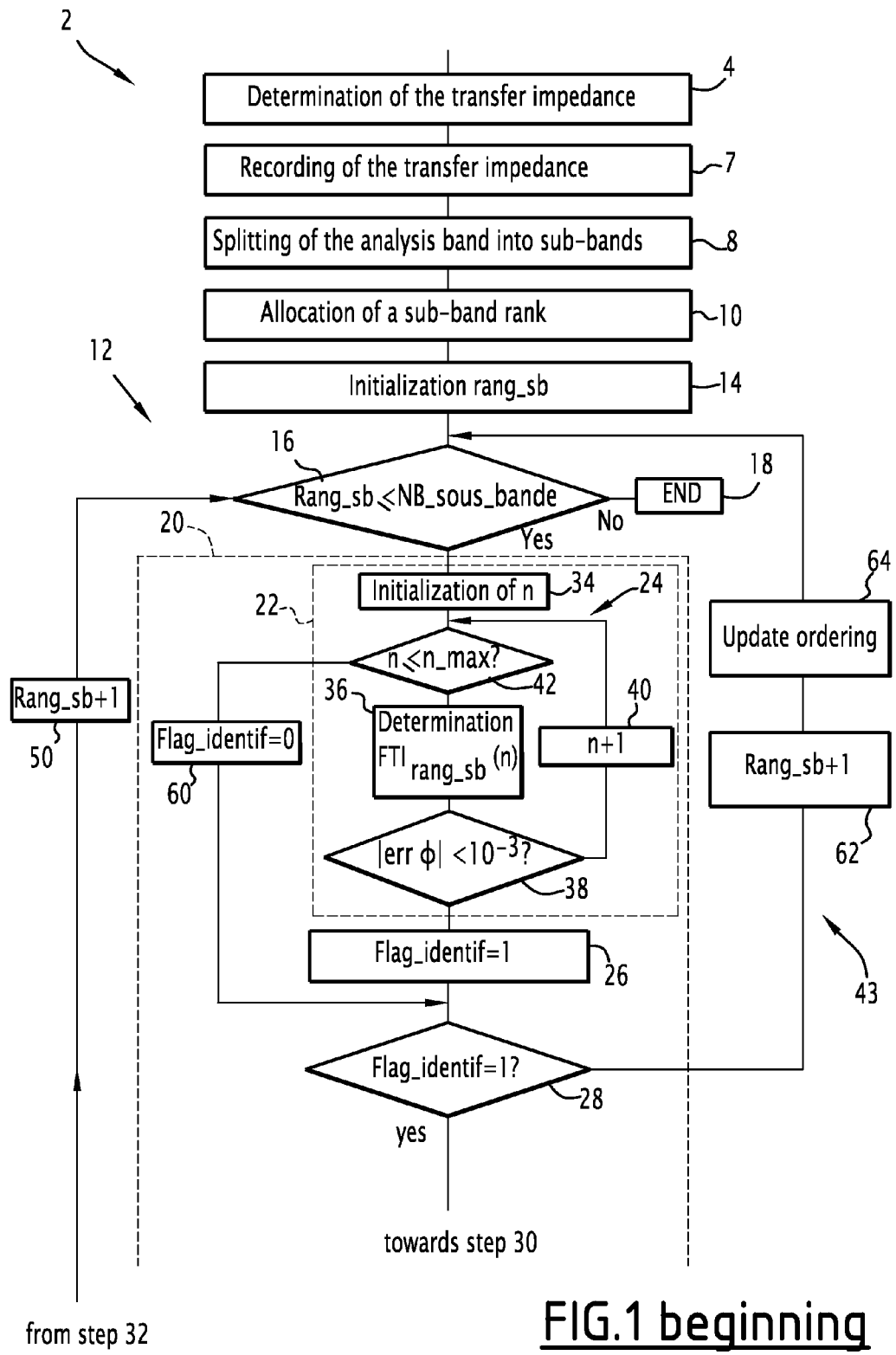
FIG.1 beginning

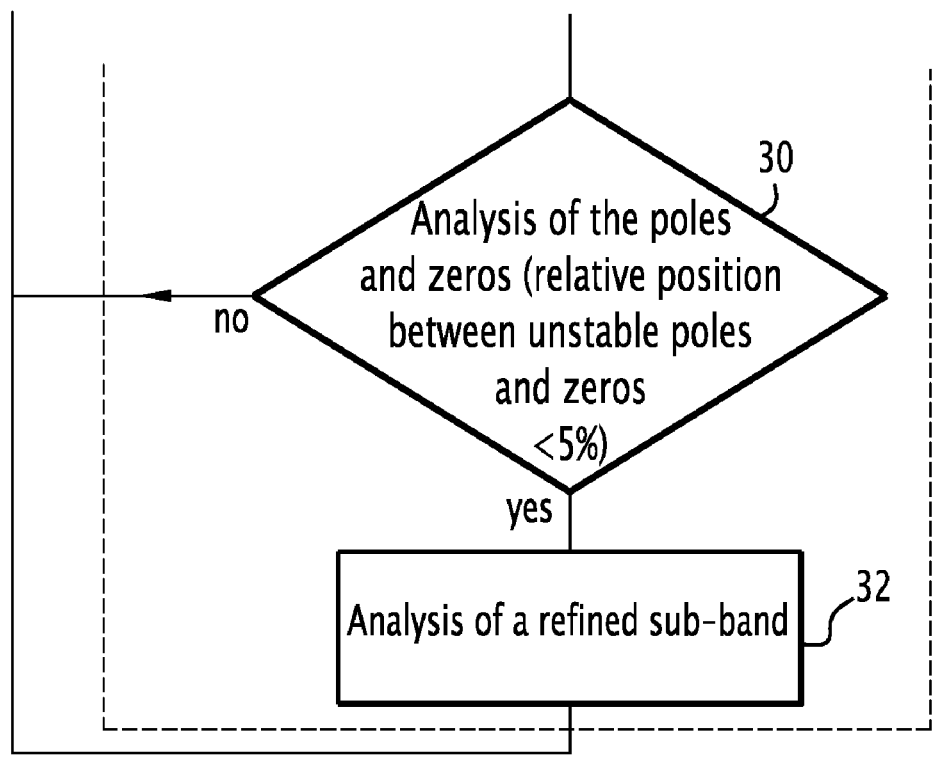
FIG.1 end

AUTOMATION OF THE ZERO-POLE IDENTIFICATION METHODS FOR THE STABILITY ANALYSIS OF MICROWAVE ACTIVE CIRCUITS

The invention relates to an automatic method of analyzing stability of active electrical circuits, a system for implementing the method with a computer program, and such a computer program.

In order to avoid unwanted oscillations in transistor- and/or diode-based circuits, e.g. MMICs (Microwave Monolithic Integrated Circuits), it is known to analyze the stability of such so-called active circuits using a technique based on system identification methods from the frequency response of linearized circuits around an established operating condition.

The frequency response of linearized circuits around an established operating condition (in direct current (DC) or periodic current) is obtained using a computer-assisted design (CAD) circuit software tool and by carrying out the following steps:
  simulating the operation of the circuit in the established state (DC or periodic) defining the operating point of the circuit whereof the stability must be analyzed, and
  varying the frequency, in a predetermined frequency band, of a current/voltage signal injected into a node/branch of the circuit, this signal represents the input of the linearized circuit and is qualified as a "weak" signal so as not to change the established state, and
  determining, using the simulation tool, at output, the circuit's response to this signal, a voltage in a node in the case of a current signal injection, or a current in another branch in the case of a voltage signal injection.

Thus, an input/output frequency response corresponding to the linearization of the circuit around its established state is obtained as a set of modules and phases of the transfer impedance or admittance of the circuit as a function of the frequency.

From the transfer impedance or admittance values, known methods for identifying transfer functions used automatically as a model can be implemented to study the electrical stability of the circuit. For example, the Scilab software tool allows such an identification.

The principle of splitting a stability analysis band into smaller bands on which the stability analysis is done more locally is also known.

During the implementation of the identification method using the Scilab software tool, the operator must first select an order of the model transfer function that he determines empirically through several trials while visually assessing the quality of the identification.

The absence of rules governing the determination of an identification transfer function as being most adapted to the stability analysis causes a long and tedious search for stability and the impossibility of automating such a search.

The technical problem is to determine a structured method of looking for an automatic identification transfer function, adapted to the stability analysis of the circuit, and fully automated.

To that end, the invention relates to a method for analyzing the electrical stability of an active circuit intended to operate in a predetermined frequency domain according to a predetermined linear or non-linear operating condition, comprising the following steps:
  starting from a physical model provided by the CAD-type software tool for the circuit, determining a frequency response of the circuit in the form of an evolution of the transfer impedance I(f) or the transfer admittance A(f) of the circuit as a function of the frequency, the frequency describing a discrete analysis frequency band and the frequency response corresponding to the linearization of the circuit around the solution in a steady state (DC, weak signal or strong signal),
  recording the transfer impedance or admittance I(f) or A(f) in the form of a first discrete function of the module (M) of the impedance or admittance as a function of the analysis frequency (f) and a second discrete function of the phase ($\phi$) of the impedance or admittance as a function of the analysis frequency (f),
  dividing the analysis band (B) into sub-bands, each sub-band surrounding a different local extremum of the module (M) of the transfer impedance or admittance I(f) or A(f),
  ordering the set of sub-bands following a sequence while assigning a rank to each sub-band,
  in an elementary identification step, for a sub-band having a fixed rank (rang_sb) and a predetermined transfer function order (n):
    identifying a transfer function ($TFI_{ranf\_sb}$ (n)) having the predetermined order (n) close in terms of a functional distance to the transfer impedance or admittance ($I_{mng\_sb}$ (0)) restricted to the fixed-rank sub-band when the frequency describes the fixed sub-band,
  characterized in that:
    for a sub-band having a fixed rank (rang_sb), the method comprises a step for automatically determining a transfer function (($TFI_{ranf\_sb}$ (n_opti)) adapted to the stability analysis, the automatic determination step being carried out in the form of an identification loop parameterized according to an increasing current transfer function order (n) and implementing the elementary identification step in which the predetermined order is the order of the current transfer function,
    in that each elementary identification step implemented in the identification loop comprises a step consisting of calculating a phase error function err$\phi$(n) as being the set of phase errors described when the frequency describes the fixed-rank sub-band, the phase error at a given frequency being the difference between the phase of the second function and the identified transfer phase, and determining a norm for the error function, and in that
    the path of the identification loop is stopped when a norm of the phase error function has exceeded a predetermined phase error threshold value, and in that it comprises a step consisting of
    determining the electrical stability of the circuit from the positions of the poles and the zeros of the transfer function identified in the automatic determination step.

According to specific embodiments, the method includes one or several of the following features:
  an identification transfer function of order n is even and its Laplace transform T(p) is written:

$$T(p) = \frac{a_n p^n + a_{n-1} p^{n-1} + \ldots + a_1 p + a_0}{b_n p^n + b_{n-1} p^{n-1} + \ldots + b_1 p + b_0}$$

in which $a_n, a_{n-1}, \ldots a_1, a_0, b_n, b_{n-1}, \ldots b_1, b_0$ designate real coefficients and p designates the temporal drift Laplace operator;
  an identification transfer function of order n is odd and its Laplace transform T(p) is written:

$$T(p) = \frac{a_n p^n + a_{n-1} p^{n-1} + \ldots + a_1 p + a_0}{b_{n-1} p^{n-1} + b_{n-2} p^{n-2} + \ldots + b_1 p + b_0}$$

in which $a_n, a_{n-1}, \ldots a_1, a_0, b_{n-1}, b_{n-2}, \ldots b_1, b_0$ designate real coefficients and p designates the temporal drift Laplace operator;

the norm of the error function is the maximum absolute value of the phase error over the set of phase errors described when the frequency describes the fixed-rank sub-band;

the loop is stopped when the norm of the error function is below a threshold value between $10^{-5}$ and $10^{-1}$, and preferably equal to 0.001;

the method comprises a limiting loop of the order of the transfer function automatically determined in the automatic identification loop when the current order (n) exceeds a predetermined value (n_max), the limiting loop including the following steps:

interrupting the automatic identification loop, splitting the fixed-rank sub-band into two smaller sub-bands, and updating the sub-band ordering sequence by allocating the rank already set to a first of the sub-bands obtained by splitting and the rank already set incremented by one unit to the second of the sub-bands obtained by division remaining, and by offsetting the rank of the remaining sub-bands, the rank of which is greater than the fixed rank by one unit, and the method comprises a step consisting of implementing the identification loop for the first sub-band obtained by division in the step for splitting the fixed-rank sub-band;

the method comprises the following steps:

when the stop criterion based on crossing the predetermined phase error threshold value is met, determining the complex poles and zeros of the automatically identified transfer function, and in a step for analyzing a refined sub-band, when a pole and a zero exist with a positive real part close to at least one threshold distance in the predetermined complex plane, restricting the fixed-rank sub-band being analyzed to a refined analysis band centered on the local extremum of the sub-band being analyzed and with a relative width in relation to the width of the sub-band equal to a predetermined value;

in the step for analyzing a refined sub-band, when a number of points of the transfer impedance or admittance exists in the refined sub-band that is at least equal to a predetermined value, the fixed rank is allocated to the refined sub-band, and an automatic identification loop of the same type as the identification loop described above is implemented in the refined sub-band, then the complex poles and zeros of the transfer function automatically identified in the refined sub-band are determined, and it is verified whether an instability still exists;

in the step for analyzing a refined sub-band, when the number of points in the refined sub-band is less than or equal to the predetermined value, then that band is extended until its number of points is equal to the predetermined value; and it comprises a loop in which the sub-bands are scanned by varying the rank allocated to each of them and the electrical stability in each sub-band is analyzed.

The invention also relates to a method of making an electrical circuit comprising the following steps:

mechanically and electrically designing an electrical circuit and representing it via a physical model, validating the electrical stability of the circuit using the method as defined above, making the electrical circuit having the electrical stability characteristics defined in the analysis method as defined above.

The invention also relates to a computer program product comprising program instructions to carry out the steps of the method as defined above when said program is operating on a computer.

The invention also relates to a tool for analyzing the electrical stability of an active circuit intended to operate in a predetermined frequency domain according to a predetermined linear or nonlinear operating condition, comprising:

a software tool of the CAD type for the circuit, capable of determining, from a physical model, a frequency response of the circuit in the form of an evolution of the transfer impedance or admittance I(f) or A(f) of the circuit as a function of the frequency, the frequency describing a discrete analysis frequency band and the frequency response corresponding to the linearization of the circuit around the solution of the established state, a memory for recording the transfer impedance I(f) or transfer admittance A(f) in the form of a first discrete function of the module (M) of the impedance as a function of the analysis frequency (f) and a second discrete function of the phase ($\phi$) of the impedance as a function of the analysis frequency (f), a means for splitting the analysis band (B) into sub-bands, each sub-band surrounding a different local extremum of the module (M) of the transfer impedance or admittance I(f) or A(f), a means for ordering the set of sub-bands according to a sequence by allocating a rank to each sub-band, an elementary identification means capable, for a sub-band having a fixed rank (rang_sb) and a predetermined transfer function order (n), of identifying a transfer function ($TFI_{ranf\_sb}$ (n)) having the predetermined order (n) close to the direction of a functional distance of the transfer impedance or admittance ($T_{rang\_sb}$ (f)) restricted to the fixed-rank sub-band when the frequency describes the fixed-rank sub-band, characterized in that it comprises:

a means (22) for automatically determining a transfer function (($TFI_{ranf\_sb}$ (n_opti)) adapted to the stability analysis, for a sub-band having a fixed rank (rang_sb) capable of executing an identification loop (24) parameterized according to an increasing current transfer function order (n) and activating the elementary identification means by providing it with the order of the current transfer function as predetermined order, the elementary identification means being capable of calculating a phase error function err$\phi$(n) as being the set of phase errors described when the frequency describes the fixed-rank sub-band, the phase error at a given frequency being the difference between the phase of the second function and the phase of the identified transfer function and determining a norm of the error function, and in that the automatic determination means is capable of stopping the automatic identification loop when the norm of the phase error function has exceeded a predetermined phase error threshold, and in that it comprises means for determining the electrical stability of the circuit from the positions of the poles and zeros of the transfer function identified in the automatic determination step.

Figure 3:
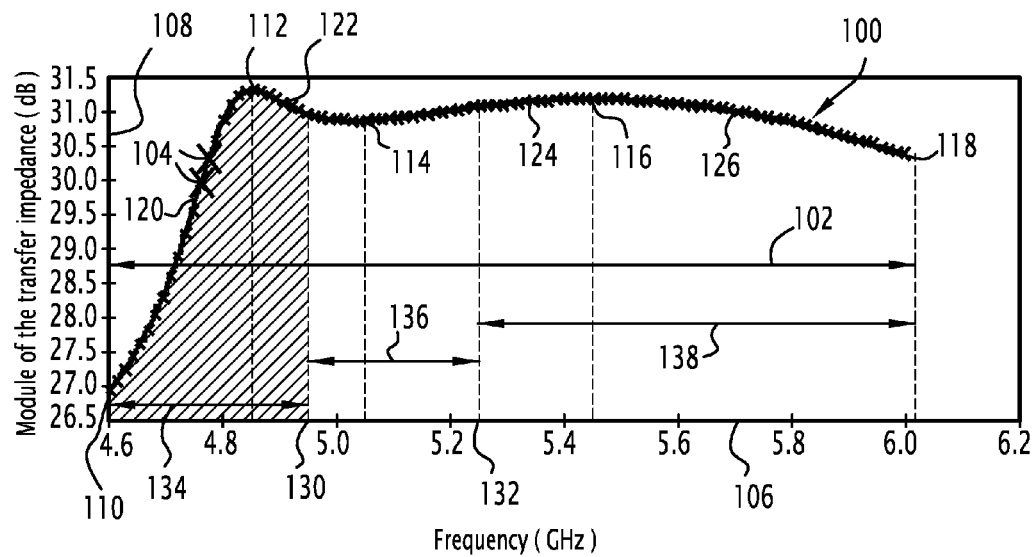
Figure 4:
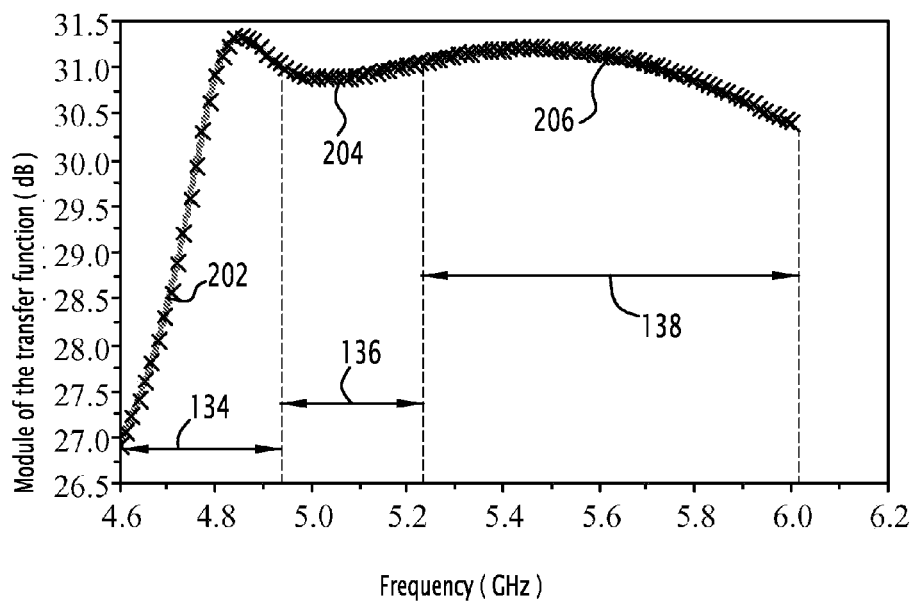
Figure 5:
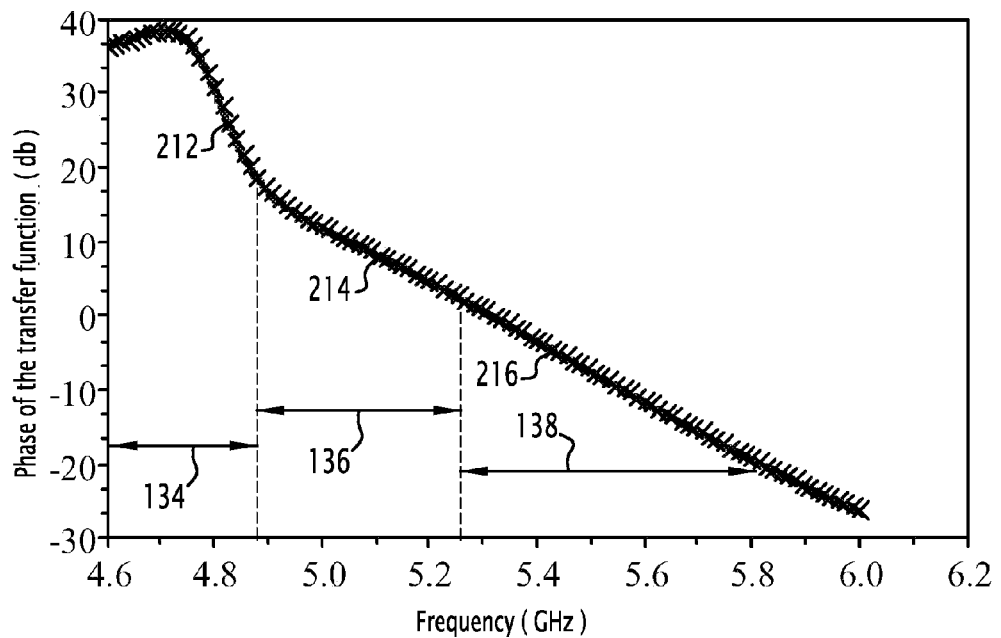
Figure 6:
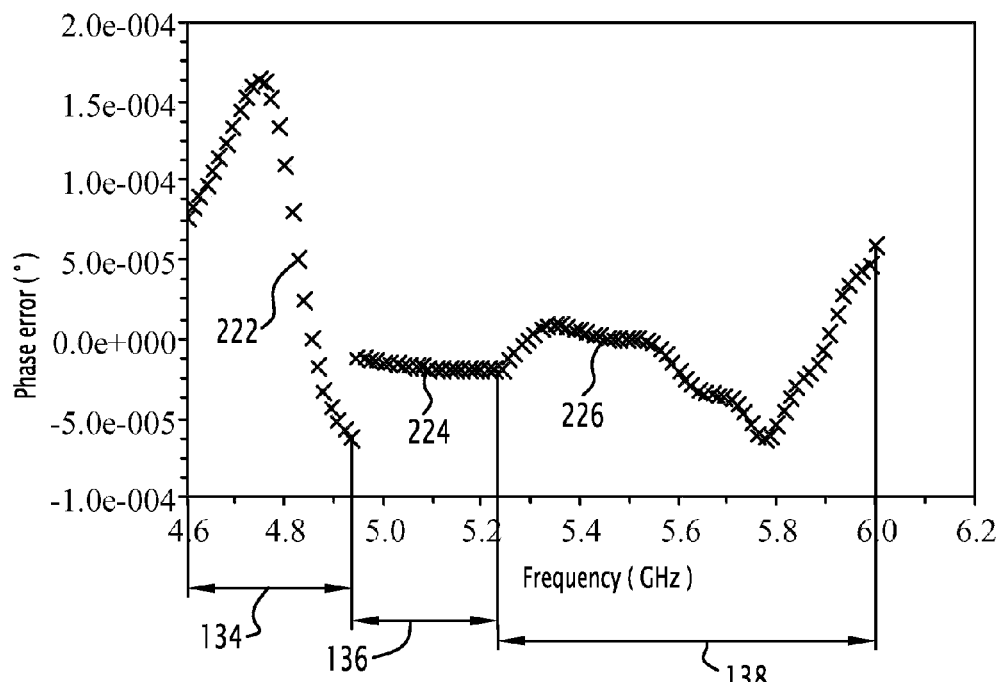
Figure 7:
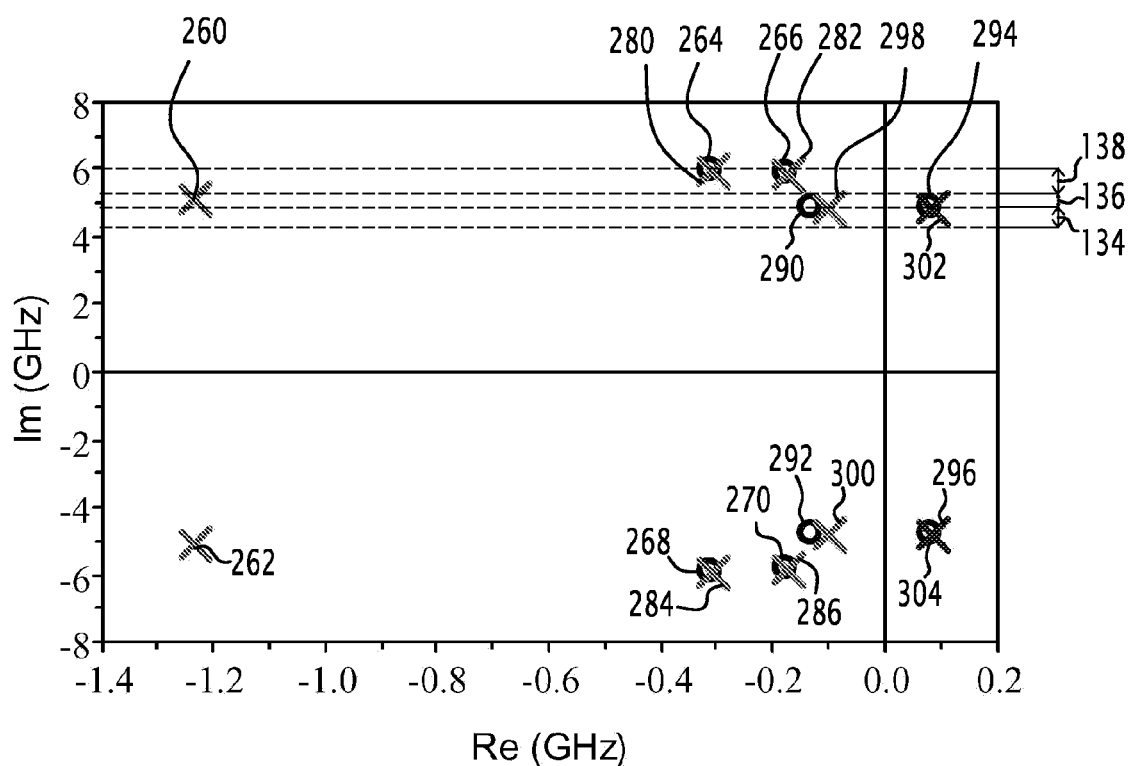

The invention will be better understood upon reading the description of a single embodiment that follows, provided solely as an example and done in reference to the appended drawings, in which:

FIG. 1 is a flowchart of the inventive method,

FIG. 2 is a block diagram of an active circuit operating in linearization mode around the weak signal solution in established operating condition, FIG. 3 is a view of a line showing the evolution, as a function of the frequency of the module, of a simulated transfer impedance and observed in an analysis frequency band with splitting into three sub-bands, FIG. 4 is a view of the line showing the evolution, as a function of the frequency of the module, of the three identification functions with a respective order each corresponding to the transfer impedance restricted to a sub-band corresponding to FIG. 3, the identification function being obtained in the automatic identification step 22 of the method of FIG. 1, FIG. 5 is a view of a line showing the evolution, as a function of the frequency, of the phase of the three identification functions with a respective order each corresponding to the transfer impedance restricted to the corresponding sub-band of FIG. 3, the identification function being obtained in the automatic identification step of the method described in FIG. 1, FIG. 6 is a view of the phase deviations between the phases of the identification function obtained in the automatic identification step and the phases of the simulation points of the transfer impedance successively restricted to the first, second, and third sub-bands, FIG. 7 is an illustration in the complex plane of the poles and zeros of the identification functions illustrated in FIGS. 4 and 5.

According to FIG. 1, a method 2 for analyzing the electrical stability of an active circuit operating in a frequency domain according to a predetermined nonlinear operating condition comprises a set of steps with different loops.

A typical active circuit is for example a MMIC comprising transistor-based circuits integrated on one or several substrates, the entire assembly being enclosed under vacuum and sealably in a metal housing.

In a first step 4, the frequency response of the active circuit is determined by simulation using a software tool of the CAD (Computer-Assisted Design) type, such as a tool (the ADS electrical simulator by Agilent) using SPICE-type modeling (Tajima, Curtis, TOM, etc.) of the elementary components of the circuit.

According to FIG. 2, the frequency response in linearization mode around an operating point in established conditions is shown in the form of the evolution of the transfer impedance I(f) or admittance A(f) of the circuit as a function of the scanning frequency f of a weak signal $\epsilon(f)$.

The transfer impedance or admittance I(f) or A(f) of the circuit corresponds to an input terminal 5 and an output terminal 6 of the predetermined circuit.

The circuit operates here at a predetermined established non-linear operating condition frequency $f_0$ and output electrical power $P_0$, defining an operating point of the circuit, by injecting a first signal of predetermined amplitude $e_0$ ($f_0$, $P_0$) at the input terminal 5.

The weak signal $\epsilon(f)$ associated with a scanning frequency f constituting a second signal is also injected at the input terminal 5 of the circuit and superimposed on the first signal $e_0$ ($f_0$, $P_0$), the second signal being qualified as a "weak signal" due to its weak amplitude relative to that of the first signal, for example below 40 dB relative to the amplitude of the first signal $e_0$ ($f_0$, $P_0$). It should be noted that for the strong signal analyses, certain simulators have a so-called mixer mode making it possible, in principle, to extract the linearization of the circuit without having to suitably specify the level of the "low signal" generator (obtainment of conversion matrices). Failing this, the user will have to suitably adjust the level of the disturbance.

The output signal at the scanning frequency f, noted s(f) and present at the output terminal 6, is determined by simulation.

The transfer impedance I(f) or transfer admittance A(f) is defined as being equal to $s(f)/\epsilon(f)$.

The scanning frequency f of the weak signal $\epsilon(f)$ varies in a predetermined frequency band by increments, the scanning frequency being different by a harmonic or sub-harmonic at any order of the frequency $f_0$ of the first signal $e_0$ ($f_0$, $P_0$).

The scanning frequency thus discretely describes a discrete analysis frequency band B and the measured frequency response corresponds to the linearization of the circuit around the weak signal solution of a nonlinear established operating condition.

Alternatively, the first signal is a signal occupying a narrow band relative to the stop-band of the circuit.

Alternatively, the transfer impedance, transfer admittance, respectively, is a measured transfer impedance, transfer admittance, respectively.

In a subsequent step 7, the simulated transfer impedance or admittance corresponding to a physical model is recorded in the form of a first discrete function and a second discrete function.

The first function represents the module M(f) of the transfer impedance I(f) or admittance A(f), as a function of the scanning frequency f, forming the analysis band B.

The second function represents the phase $\phi(f)$ of the transfer impedance I(f) or admittance A(f) as a function of the same scanning frequencies as for the module M(f).

Then, in a step 8, the analysis band B is split into sub-bands, each sub-band surrounding a different local extremum of the module M of the transfer impedance or admittance $I_{rang\_sb}(f)$ restricted to the sub-band with rank rang_sb.

The changes of slope direction of the first function M(f) are detected using any traditional numerical analysis method.

Indices i of the scanning frequencies ordered according to an increasing order corresponding to the slope changes are recorded in a list with a first and last index.

A qualified splitting vector V is created that groups together the slop direction change indices as well as their middles excluding the middles corresponding to the first and last indices.

The sub-bands $SB_i$ are determined as being each band portion delimited by two successive middles and the total number of sub-bands determined is allocated a parameter referenced NB_sous_bande.

In a subsequent step 10, a separate whole rank rang_sb is allocated to each sub-band and the sub-bands are thus ordered according to an increasing sub-band order.

Then, a first path loop 12 of the sub-bands to be analyzed is initialized in an initialization step 14.

The common path parameter of the first loop is the sub-band rank. It is referenced rang_sb and it is set to the value of the integer one in the initialization step 14.

In a step 16 for connecting the first loop 12, a comparison test of the current value of the path parameter rang_sb of the first loop is done.

According to that test, if the current sub-band rank parameter rang_sb is greater than the value of the total number of sub-bands NB_sous_bande, then the stability analysis method 2 is terminated by an end-of-method step 18.

Conversely, the method 2 continues to carry out a step 20 of analyzing the electrical stability of the circuit in the frequency sub-band corresponding to the current sub-band rank rang_sb.

The analysis step 20 comprises a step 22 for automatically determining an identification transfer function $FTI_{rang\_sb}$ (n_opti), of a type adapted to automatic modeling, and adapted to the stability analysis of the transfer impedance or admittance $I_{rang\_sb}(f)$ restricted to the frequency sub-band corresponding to the current sub-band rank rang_sb.

The automatic determination step 22 is carried out in the form of a second loop 24 parameterized according to a second current loop parameter formed by an order referenced n of an identification transfer function $FTI_{rang\_sb}$ (n).

The order n here corresponds to the degree of the Laplace transform T(p) of the identification transfer function whereof the even form is chosen such that the transform is written:

$$T(p) = \frac{a_n p^n + a_{n-1} p^{n-1} + \ldots + a_1 p + a_0}{b_n p^n + b_{n-1} p^{n-1} + \ldots + b_1 p + b_0}$$

in which $a_n, a_{n-1}, \ldots a_1, a_0, b_n, b_{n-1}, \ldots b_1, b_0$ designate real coefficients and $p^k$ designates the temporal drift Laplace operator of order k.

Equivalently, the identification transfer function shown in the Fourier transform is written $T(j\omega)$ with $\omega$ the pulsation equal to $2.\pi.f$ where f designates the frequency.

Alternatively, an odd form of the n order transfer function is chosen and its Laplace transform is written:

$$T(p) = \frac{a_n p^n + a_{n-1} p^{n-1} + \ldots + a_1 p + a_0}{b_{n-1} p^{n-1} + b_{n-2} p^{n-2} + \ldots + b_1 p + b_0}$$

in which $a_n, a_{n-1}, \ldots a_1, a_0, b_{n-1}, b_{n-2}, \ldots b_1, b_0$ designate real coefficients and p designates the temporal drift Laplace operator.

The analysis step 20 also comprises a step 26 for loading a status in an output indicator of the second loop 24 referenced flag_identif, a step 28 for connecting and verifying the output indicator of the second loop 24, a step for analyzing poles and zeros 30 of the output transfer function $FTI_{rang\_sb}$ (n_opti) of the loop 24, a step 32 for refining the analysis of the stability of the identified transfer function $FTI_{rang\_sb}$ (n_opti) associated with the transfer impedance or admittance restricted to the first sub-band with rank rang_sb.

The second loop 24 or identification loop comprises a step 34 for initializing the order n, an elementary identification step 36 of the n order transfer function, $FTI_{rang\_sb}$ (n) associated with the transfer impedance or admittance restricted to the sub-band of rank rang_sb, a main connection step 38 with a main stop criterion of the second loop 24, a step 40 for incrementing the order n of the identification transfer function $FTI_{rang\_sb}$ (n), and a step 42 for limitation or auxiliary connection to a third loop 43 called limitation loop with a direct limitation criterion of order n of the second loop 24, step 42 being inserted between step 34 and step 36.

In the initialization step 34, the value of the current order n is set at a value between 1 and 20. Here, preferably the value of the current order n is set at a value equal to 3.

Then in step 42, it is verified whether the current order n is less than or equal to a predetermined maximum order value referenced n_max, here equal to 20.

The maximum order value n_max is between 1 and 100, preferably between 15 and 30, and here is equal to 20.

In the event the current order n is less than or equal to a maximum order value, then the method 2 is continued in step 36.

In the elementary identification step 36, the rank of the sub-band and the order of the transfer function being fixed respectively by the first current parameter rang_sb of the first loop 12 and the second current parameter n of the second loop 24, the identification transfer function of order n $FTI_{rang\_sb}$ (n) is determined by adjusting the coefficients so that the identification transfer function $FTI_{rang\_sb}$ (n) comes as close as possible to the transfer impedance or admittance $I_{rang\_sb}$ (f) restricted to the analysis sub-band with current sub-band rank rang_sb.

To define the proximity of the n order identification transfer function $FTI_{rang\_sb}$ (n) relative to the transfer impedance or admittance $I_{rang\_sb}$ (f) restricted to the analysis sub-band with current sub-band rank rang_sb, a functional distance is defined between said transfer function and said transfer impedance or admittance.

The distance is traditionally defined as being a distance between two vectors whereof the components are complex numbers, a first vector corresponding to the n order transfer function $FTI_{rang\_sb}$ (n) and a second vector corresponding to the transfer impedance $I_{rang\_sb}$ (f).

The Scilab tool implements a known algorithm based on the least squares method making it possible to thereby obtain an identification transfer function.

In step 36, the identified n order transfer function $FTI_{rang\_sb}$ (n) with complex values is broken down into its module forming a first component $C1(n,f)$ and its phase forming a second component $C2(n,f)$.

Then in the same step 36, a phase error function err$\phi$(n) is calculated as being the set of phase errors described when the frequency describes the sub-band with fixed rank rang_sb, the phase error at a given frequency being the difference between the phase of the second function $\phi(f)$ of the transfer impedance or admittance $I_{rang\_sb}$ (f) restricted to the sub-band with sub-band rank rang_sb and the phase $C2(n,f)$ of the identified current n order transfer function $FTI_{rang\_sb}$ (n).

Then, in a same step 36, a norm of the phase error function err$\phi$(n) is calculated.

For example, the norm of the phase error function is the maximum phase error absolute value described over all of the phase errors of the phase error function err$\phi$(n) when the frequency f describes the sub-band with current rank rang_sb.

Alternatively, the norm of the phase error function err$\phi$(n) is a quadratic norm equal to the square root of the quadratic sum of the phase errors described over all of the phase errors of the phase error function err$\phi$(n) when the frequency describes the sub-band with current rank rang_sb.

In step 38, the norm of the phase error function err$\phi$(n) is compared to a predetermined phase error threshold value, this comparison constituting the main stop and output criterion of the second loop 24.

The phase error threshold value is between $10^{-8}$ and 10, preferably between $10^{-5}$ and $10^{-1}$, and here is equal to 0.001.

If the norm of the phase error function err$\phi$(n) is greater than or equal to the predetermined phase error threshold value, then the current order n of the identification transfer function $FTI_{rang\_sb}$ (n) is increased by one unit in the incrementation step 40 and the path of the second loop 24 continues until step 42 with the current order n resulting from the incrementation 40.

Conversely, if the norm of the phase error function is below the predetermined phase error threshold value, then the path inside the second loop 24 is stopped and the output status indicator flag_identif of the second loop 24 is set to 1 to indicate that the output status of the second loop 24 is that corresponding to the satisfaction of the main stop criterion of the second loop 24, i.e. the norm of the phase error function has gone below the predetermined phase error threshold value. In that case, step 20 continues in the step 28 for connecting and verifying the output indicator flag_identif of the second loop 24.

In the rodding step 28, if the output indicator flag_identif of the second loop 24 is equal to one, then the step for analyzing the poles and zeros 30 is carried out.

During step 30, the complex poles and zeros of the identified transfer function having an order referenced n_opti are determined by a traditional calculation method. The order referenced n_opti corresponds to the current order n existing at the output of step 38.

The poles and zeros are complex numbers whereof the real parts and the imaginary parts are the vector coordinates associated in the complex plane.

The real parts and the imaginary parts are frequency sizes.

Then, during the same step 30, the respective positions of the poles and the zeros determined in the complex plane are analyzed.

When there is no pole and zero with a positive real part that are distant in the complex plane by a relative distance smaller than or equal to a predetermined relative threshold distance, then it is decided that the circuit is electrically stable in the sub-band with current rank rang_sb of the first loop 12.

The relative distance of a pole in relation to a zero is defined here as being the ratio of the Euclidian distance in the complex plane between the pole and the zero on a radius vector of the pole or the zero relative to the origin of the complex plane.

When there is no pole and zero with a positive real part that are distant in the complex plane by a relative distance smaller than or equal to a predetermined relative threshold distance, the path parameter rang_sb of the first loop 12 is incremented by one unit in step 50 and the stability analysis method 2 of the circuit then continues in the following analysis sub-band by the connection in step 16 with the incremented value rang_sb.

The value of the relative threshold distance is between 0.1% and 100%, preferably between 1% and 5%, and here equal to 3%.

When there is a pole and a zero with a positive real part that are distant in the complex plane of a relative distance smaller than or equal to the predetermined relative threshold distance, then in the refining step 32, the sub-band with current rank rang_sb being analyzed is restricted to a refined or narrower analysis sub-band, centered on the local extremum of the sub-band being analyzed with current rank rang_sb. The relative width of the refined sub-band in relation to the width of the sub-band being analyzed is between 0.1% and 100%, preferably between 1% and 5%, and here is equal to 3%.

When a number of transfer impedance or admittance points exists in the refined sub-band that is at least equal to a predetermined value of a minimum number of points between 1 and 500, preferably between 10 and 20, here equal to 15, in step 32, the current fixed sub-rank rang_sb is allocated to the refined sub-band, an automatic identification loop of the same type as the loop 24 is implemented in the refined sub-band, then the complex poles and zeros of the transfer function automatically identified in the refined sub-band are determined in a manner similar to step 32 to verify whether an instability still exists.

When the number of points in the refined sub-band is less than or equal to the predetermined value of the minimum number of points, then in step 32 it is determined whether an electrical instability exists.

Then, the path parameter rang_sb of the first loop 12 is incremented by one unit in the incrementation step 50 and the analysis method of the circuit is then continued in the following analysis sub-band by the connection in step 16 with the incremented value rang_sb.

In the event the current order n is verified in the limitation step 42 as being greater than the maximum order value n_max, then a connection is done on the third direct limitation loop 43 of the order n sought in the second loop 24.

The third loop 43 comprises, executed successively, the limitation step 42, a step 60 for loading the output indicator flag_identif of the second loop 24 at zero, the rodding step 28, a step 62 for splitting the current-rank sub-band in two, a step 64 for updating the sub-band ordering sequence, and step 16.

The step 42 for limiting the order of the automatically determined transfer function interrupts the second loop 24 when the current order n exceeds the maximum order value n_max.

Then, in step 60, the output indicator flag_identif of the second loop 24 is set at zero.

Then, in the rodding step 28, the status of flag_identif is verified. When it is at zero, the rodding step 28 connects the method 2 to the step 62 for splitting the current-rank sub-band rang_sb into two smaller adjacent sub-bands.

Then in step 64, the ordering sequence of the sub-bands is updated by allocating the first current rank rang_sb to a first sub-band obtained by division in step 62 and the current rank incremented by one unit to the second sub-band obtained by division, and by shifting, by one unit, the rank of the remaining sub-bands whereof the rank is strictly greater than the current rank rang_sb plus one unit.

Then, the second loop 24 is implemented again by the connection in step 16.

According to FIG. 3, the transfer impedance or admittance module 100 simulated and observed in an analysis frequency band 102 comprises a series of points 104 shown by crosses and referenced by an abscissa along an axis of the frequencies 106 expressed in GHz, and an ordinate along a gain axis 108 between an input and an output expressed in dB.

The transfer impedance or admittance module is interpolated by a smoothing interpolation function between the different points 104.

The transfer impedance or admittance module 100 comprises local extrema with an initial point 110, a first local maximum 112 followed by a local minimum 114, then a second local maximum 116 and a final point 118.

The transfer impedance or admittance module 100 comprises four successive segments 120, 122, 124, 126 having slopes with opposite signs. The first segment 120 and the third segment 124 have a positive slope, while the second 122 and fourth 126 have a negative slope.

Two middles are determined, a first middle 130 of a first frequency segment delimited by the abscissa corresponding to the first local maximum 112 and the local minimum 114, and a second middle 132 of a second frequency segment delimited by the abscissa corresponding to the local minimum 114 and to the second local maximum 116.

A first sub-band 134 is determined as being the frequency segment delimited by the abscissa of the initial point 110 and the first middle 130.

A second sub-band 136 is determined as being the frequency segment delimited by the first middle 130 and the second middle 132.

A third sub-band 138 is determined as being the frequency segment delimited by the second middle 132 and the abscissa of the final point 118.

The sub-bands 134, 136, 138 are determined during step 8

During step 10, the ranks of different sub-bands 1, 2 and 3 are respectively allocated to sub-bands 134, 136 and 138.

According to FIG. 4, FIG. 5, respectively, crosses indicate the modules, the transfer impedance or admittance phases, respectively, successively restricted to the first, second, third sub-bands 134, 136, 138 described in FIG. 3.

According to FIG. 4, three module curves 202, 204, 206 in unbroken lines show the modules of three separate transfer functions successively identified in the automatic identification step 22 and each corresponding to the identification of the transfer impedance or admittance respectively restricted to each sub-band 134, 136, 138.

The axis of the abscissa is the axis of the frequencies scaled in GHz while the axis of the ordinates is the axis of the modules scaled in dB.

According to FIG. 5, three phase curves 212, 214, 216 in unbroken lines show the phases of the three separate transfer functions successively identified in the automatic identification step 22 and each corresponding to the identification of the transfer impedance or admittance respectively restricted to each sub-band 134, 136, 138, and also corresponding to the curves 202, 204, 206.

The axis of the abscissa is the axis of the frequencies scaled in GHz, while the ordinate axis is the axis of the phases scaled in degrees.

According to FIG. 6, three phase error curves 222, 224, 226, each formed by a series of points, show the phase deviations between the phases described in FIG. 5 of the three distinct transfer functions successively identified in the automatic identification step 22 and the phases corresponding to the transfer impedance or admittance, when they have been simulated, shown by crosses in FIG. 5.

The three curves 222, 224, 226 each correspond to a single sub-band 134, 136, 138.

The abscissa axis is the axis of the frequencies scaled in GHz while the ordinate axis is the axis of the phase errors scaled in units equal to 0.5 time $10^{-5}$ degrees.

It should be noted that in FIG. 5, this deviation is not visible due to the scale of the ordinate axis, which is clearly larger than that of FIG. 6, which shows an enlarged detailed view of the phase variations whereof the order of magnitude is smaller than some ten thousandths of degrees.

According to FIG. 6, considering a norm of the phase error function defined as being the maximum out of the set of a sub-band of the absolute values of the phase deviations and considering an output threshold value of the loop 24 equal to 0.001, it indeed appears that the norm of the phase error function for each sub-band 134, 136, 138 is smaller than the output threshold value of the loop 24 and that the corresponding order n_opti of each transfer function identified in the associated sub-band makes it possible to satisfy the main output criterion of the loop 24.

According to FIG. 7, the poles and the zeros of the three transfer functions identified and described in FIGS. 4 and 5 are respectively shown by crosses and circles.

A splitting of the sub-bands 134, 136, 138 on the complex half-plane of the positive ordinates along the axis Im, is shown by bands parallel to the abscissa axis Re.

The abscissa axis is a frequency axis scaled in units each equal to 0.1 GHz and the ordinate axis is a frequency axis scaled unitarily in GHz.

A first pole 260 and a second pole 262 that is symmetrical relative to the axis Re correspond to the transfer function identified for the second sub-band 136.

First, second, third, fourth zeros respectively referenced 264, 266, 268, 270 correspond to the transfer function identified for the third sub-band 138.

Third, fourth, fifth, sixth poles respectively referenced 280, 282, 284, 286 correspond to the transfer function identified for the third sub-band 138.

Fifth, sixth, seventh, eighth zeros respectively referenced 290, 292, 294, 296 correspond to the transfer function identified for the first sub-band 134.

Seventh, eighth, ninth, tenth poles respectively referenced 298, 300, 302, 304 correspond to the transfer function identified for the first sub-band 134.

The real parts of the poles 260, 262 being negative, the electrical circuit is determined in step 30 as being stable in the second sub-band 136.

The real parts of the zeros 264, 266, 268, 270 and the real parts of the poles 280, 282, 284, 286 being negative, the electrical circuit is determined in step 30 as being stable in the third sub-band 138.

There are zero-pole pairs 294 and 302, 296 and 304, whereof the real parts are positive, and for which the relative distance between a zero and a matched pole is less than equal to 5%, value here considered to be the relative threshold distance value. In step 30, it is decided to carry out the analysis step 32 on a refined band and in that example the presence of unstable pole/zero pairs is confirmed for the frequency of 4.8 GHz.

A tool for carrying out the method 2 comprises means simulating the transfer impedance or admittance I(f) or A(f) from electrical diagrams and mechanical plans of the circuit, a memory for recording the transfer impedance or admittance I(f) or A(f), a means for dividing the analysis band into sub-bands, a means for elementary identification of an elementary transfer function from a sub-band, with a predetermined order and the transfer impedance or admittance, a means for automatically determining a transfer function suitable for the stability analysis of the circuit, and a means for determining the electrical stability of the circuit from the positions of the poles and zeros of the transfer function determined by the automatic determination means.

In the recording memory, the transfer function is saved in the form of a first discrete function of the module of the transfer impedance or admittance as a function of the analysis frequency and a second discrete function of the phase of the transfer impedance or admittance as a function of the analysis frequency.

Each sub-band surrounds a different local extremum of the impedance module as a function of the frequency.

The elementary transfer function is obtained from the transfer impedance or admittance restricted to a sub-band. It has a predetermined order and is of the type used in automatic modeling.

The automatic determination means is capable of implementing an identification loop parameterized according to an increasing current transfer function order and activating the elementary identification means by providing it with the current transfer function order as predetermined order.

The determination means is capable of stopping the path of the identification loop when a norm of the phase error function associated with the current order transfer function has exceeded a predetermined phase error threshold value.

The phase error function is the set of phase errors described when the frequency describes the fixed-rank sub-band, the phase error at a given frequency being the difference between the phase of the identified current-order transfer function and the phase of the transfer impedance or admittance.

Alternatively, the means for simulating the transfer impedance or admittance is a means for measuring the transfer impedance or admittance.

A computer program product comprises program instructions for carrying out the steps of the method 2 described above. It is for example loaded in a computer memory, then executed using data for a transfer impedance or admittance previously loaded into a memory of the computer.

The method 2 constitutes one step of a method for making an electrical circuit in which the electrical circuit is first designed mechanically and electrically, then represented via a physical model.

The values of the frequencies generating instability and the stable frequency bands constitute physical characteristics unique to the circuit.

The electrical circuit having the electrical stability features determined by the analysis method 2 then goes to the foundry for some of its components, and is assembled.

The step 22 for automatically identifying a transfer function through the loop 24 and a stop and output criterion of the loop 24 by exceeding a threshold of a phase error function makes it possible to implement a stability analysis method completely automatically.

As a result, simulation methods of the Monte Carlo type can be used. These methods make it possible to assist the design and validate the industrial manufacturing process of an electrical circuit so that it is electrically stable in a predetermined frequency band.

The identification step can be carried out with an even or odd order identification transfer function.

The presence of a loop limiting the order n guarantees the proper execution of the loop 24 by preventing it from diverging, and a reliable numerical analysis of the electrical stability.

Moreover, the limiting loop decreases the execution time of the method.

The choice of preferred values for the maximum order n_max of the transfer function to be identified, the minimum number of points required in the refining step 32, the value of the ratio of the refined sub-band to the sub-band being analyzed makes it possible to reduce the execution time of the method when it is implemented by a computer.

The invention claimed is:

1. A method for analyzing the electrical stability of an active circuit intended to operate in a predetermined frequency domain according to a predetermined linear or non-linear operating condition, comprising:

starting from a physical model provided by a CAD-type software tool for the circuit, determining a frequency response of the circuit in the form of an evolution of the transfer impedance I(f) or the transfer admittance A(f) of the circuit as a function of the frequency, the frequency describing a discrete analysis frequency band and the frequency response corresponding to the linearization of the circuit around the solution in a steady state, recording the transfer impedance or admittance I(f) or A(f) in the form of a first discrete function of the module (M) of the impedance or admittance as a function of the analysis frequency (f) and a second discrete function of the phase ($\phi$) of the impedance or admittance as a function of the analysis frequency (f), dividing the analysis band (B) into sub-bands, each sub-band surrounding a different local extremum of the module (M) of the transfer impedance or admittance I(f) or A(f), ordering the set of sub-bands following a sequence while assigning a rank to each sub-band, in an elementary identification step, for a sub-band having a fixed rank (rang_sb) and a predetermined transfer function order (n):

identifying a transfer function ($TFI_{ranf\_sb}(n)$) having the predetermined order (n) close in terms of a functional distance to the transfer impedance or admittance ($I_{rang\_sb}(f)$) restricted to the fixed-rank sub-band when the frequency describes the fixed sub-band, wherein:

for a sub-band having a fixed rank (rang_sb), the method comprises a step for automatically determining a transfer function (($TFI_{ranf\_sb}(n\_opti)$)) adapted to the stability analysis, the automatic determination step being carried out in the form of an identification loop parameterized according to an increasing current transfer function order (n) and implementing the elementary identification step in which the predetermined order is the order of the current transfer function, in that each elementary identification step implemented in the identification loop comprises a step consisting of calculating a phase error function err$\phi$(n) as being the set of phase errors described when the frequency describes the fixed-rank sub-band, the phase error at a given frequency being the difference between the phase of the second function and the identified transfer phase, and determining a norm for the error function, and in that the path of the identification loop is stopped when a norm of the phase error function has exceeded a predetermined phase error threshold value, and in that it comprises a step consisting of determining the electrical stability of the circuit from the positions of the poles and the zeros of the transfer function identified in the automatic determination step.

2. The method for analyzing the electrical stability of an active circuit according to claim 1, wherein an identification transfer function of order n is even and its Laplace transform T(p) is written:

$$T(p) = \frac{a_n p^n + a_{n-1} p^{n-1} + \ldots + a_1 p + a_0}{b_n p^n + b_{n-1} p^{n-1} + \ldots + b_1 p + b_0}$$

in which $a_n, a_{n-1}, \ldots a_1, a_0, b_n, b_{n-1}, \ldots b_1, b_0$ designate real coefficients and p designates the temporal drift Laplace operator.

3. The method for analyzing the electrical stability of an active circuit according to claim 1, wherein an identification transfer function of order n is odd and its Laplace transform T(p) is written:

$$T(p) = \frac{a_n p^n + a_{n-1} p^{n-1} + \ldots + a_1 p + a_0}{b_{n-1} p^{n-1} + b_{n-2} p^{n-2} + \ldots + b_1 p + b_0}$$

in which $a_n, a_{n-1}, \ldots a_1, a_0, b_{n-1}, b_{n-2}, \ldots b_1, b_0$ designate real coefficients and p designates the temporal drift Laplace operator.

4. The method for analyzing the electrical stability of an active circuit according to claim 1, wherein the norm of the error function is the maximum absolute value of the phase error over the set of phase errors described when the frequency describes the fixed-rank sub-band.

5. The method for analyzing the electrical stability of an active circuit according to claim 1, wherein the loop is stopped when the norm of the error function is below a threshold value between $10^{-5}$ and $10^{-1}$, and preferably equal to 0.001.

6. The method for analyzing the electrical stability of an active circuit according to claim 1, characterized in that wherein it comprises a limiting loop of the order of the transfer function automatically determined in the automatic identification loop when the current order (n) exceeds a predetermined value (n_max), the limiting loop including the following steps:
interrupting the automatic identification loop,
splitting the fixed-rank sub-band into two smaller sub-bands, and
updating the sub-band ordering sequence by allocating the rank already set to a first of the sub-bands obtained by splitting and the rank already set incremented by one unit to the second of the sub-bands obtained by division remaining, and by offsetting the rank of the remaining sub-bands, the rank of which is greater than the fixed rank by one unit, and
in that it comprises a step consisting of implementing the identification loop for the first sub-band obtained by division in the step for splitting the fixed-rank sub-band.

7. The method for analyzing the electrical stability of an active circuit according to claim 1, wherein it comprises:
when the stop criterion based on crossing the predetermined phase error threshold value is met, determining the complex poles and zeros of the automatically identified transfer function, and
in a step, when a pole and a zero exist with a positive real part close to at least one threshold distance in the predetermined complex plane, restricting the fixed-rank sub-band being analyzed to a refined analysis band centered on the local extremum of the sub-band being analyzed and with a relative width in relation to the width of the sub-band equal to a predetermined value.

8. The method for analyzing the electrical stability of an active circuit according to claim 7, wherein the step when a number of points of the transfer impedance or admittance exists in the refined sub-band that is at least equal to a predetermined value, the fixed rank is allocated to the refined sub-band, and an automatic identification loop of the same type as the loop is implemented in the refined sub-band, then the complex poles and zeros of the transfer function automatically identified in the refined sub-band are determined, and it is verified whether an instability still exists.

9. The method for analyzing the electrical stability of an active circuit according to claim 8, wherein the step when the number of points in the refined sub-band is less than or equal to the predetermined value, then that band is extended until its number of points is equal to the predetermined value.

10. The method for analyzing the electrical stability of an active circuit according to claim 1, wherein it comprises a loop in which the sub-bands are scanned by varying the rank allocated to each of them and the electrical stability in each sub-band is analyzed.

11. A method of making an electrical circuit comprising:
mechanically and electrically designing an electrical circuit and representing it via a physical model,
validating the electrical stability of the circuit using the method according to claim 1,
making the electrical circuit having the electrical stability characteristics defined in the analysis method according to claim 1.

12. A computer program product comprising program instructions to carry out the steps of the method according to claim 1 when said program is operating on a computer.

13. A tool for analyzing the electrical stability of an active circuit intended to operate in a predetermined frequency domain according to a predetermined linear or nonlinear operating condition, comprising:
a software tool of the CAD type for the circuit, capable of determining, from a physical model, a frequency response of the circuit in the form of an evolution of the transfer impedance or admittance I(f) or A(f) of the circuit as a function of the frequency, the frequency describing a discrete analysis frequency band and the frequency response corresponding to the linearization of the circuit around the solution of the established state,
a memory for recording the transfer impedance I(f) or transfer admittance A(f) in the form of a first discrete function of the module (M) of the impedance as a function of the analysis frequency (f) and a second discrete function of the phase ($\phi$) of the impedance as a function of the analysis frequency (f),
a means for splitting the analysis band (B) into sub-bands, each sub-band surrounding a different local extremum of the module (M) of the transfer impedance or admittance I(f) or A(f),
a means for ordering the set of sub-bands according to a sequence by allocating a rank to each sub-band,
an elementary identification means capable, for a sub-band having a fixed rank (rang_sb) and a predetermined transfer function order (n), of identifying a transfer function (TFI$_{ranf\_sb}$ (n)) having the predetermined order (n) close to the direction of a functional distance of the transfer impedance or admittance (I$_{rang\_sb}$ (f)) restricted to the fixed-rank sub-band when the frequency describes the fixed-rank sub-band,
wherein it comprises:
a means for automatically determining a transfer function ((TFI$_{ranf\_sb}$ (n_opti)) adapted to the stability analysis, for a sub-band having a fixed rank (rang_sb) capable of executing an identification loop parameterized according to an increasing current transfer function order (n) and activating the elementary identification means by providing it with the order of the current transfer function as predetermined order,
the elementary identification means being capable of calculating a phase error function err$\phi$(n) as being the set of phase errors described when the frequency describes the fixed-rank sub-band, the phase error at a given frequency being the difference between the phase of the second function and the phase of the identified transfer function and determining a norm of the error function, and in that
the automatic determination means is capable of stopping the automatic identification loop when the norm of the phase error function has exceeded a predetermined phase error threshold, and in that it comprises
means for determining the electrical stability of the circuit from the positions of the poles and zeros of the transfer function identified in the automatic determination step.

* * * * *